US009041489B2

(12) United States Patent
Morita et al.

(10) Patent No.: US 9,041,489 B2
(45) Date of Patent: May 26, 2015

(54) SIGNAL TRANSMISSION CABLE AND FLEXIBLE PRINTED BOARD

(71) Applicant: Sony Corporation, Tokyo (JP)

(72) Inventors: Shinya Morita, Tokyo (JP); Akira Akiba, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/250,014

(22) Filed: Apr. 10, 2014

(65) Prior Publication Data

US 2014/0312987 A1 Oct. 23, 2014

(30) Foreign Application Priority Data

Apr. 19, 2013 (JP) ................................ 2013-088074

(51) Int. Cl.

*H03K 4/06* (2006.01)
*H01P 3/12* (2006.01)
*H01P 5/107* (2006.01)
*H01P 5/02* (2006.01)
*H01P 5/12* (2006.01)

(52) U.S. Cl.

CPC ................ *H01P 3/121* (2013.01); *H01P 5/024* (2013.01); *H01P 5/107* (2013.01); *H01P 5/12* (2013.01)

(58) Field of Classification Search

USPC .......................................................... 331/137
See application file for complete search history.

(56) References Cited

U.S. PATENT DOCUMENTS 7,907,031 B2 * 3/2011 Kim et al. .................. 333/21 R

FOREIGN PATENT DOCUMENTS

JP 2003-203694 7/2003

* cited by examiner

*Primary Examiner* — Daniel Rojas
(74) *Attorney, Agent, or Firm* — Dentons US LLP

(57) ABSTRACT

A signal transmission cable includes a multi-layer parallel transmission path, a single-layer parallel transmission path, and a single-layer/multi-layer conversion section. The multi-layer parallel transmission path includes two or more dielectric waveguides stacked in upper and lower directions. Each dielectric waveguide includes a dielectric layer formed of a dielectric substance, two conductive layers formed to sandwich the dielectric layer, and two quasi-conductive walls. The two quasi-conductive walls include a plurality of via-holes electrically connected to the two conductive layers. The dielectric waveguides are arranged sharing the conductive layers in contact in the upper and lower directions. The single-layer parallel transmission path includes the two or more dielectric waveguides arranged in left- and right-hand directions on the same dielectric layer and conductive layer. The single-layer/multi-layer conversion section transmits a signal transmitted by each dielectric waveguide in the single-layer parallel transmission path to each dielectric waveguide in the multi-layer parallel transmission path.

9 Claims, 13 Drawing Sheets

SIGNAL TRANSMISSION CABLE AND FLEXIBLE PRINTED BOARD

CROSS REFERENCE TO RELATED APPLICATIONS

This application claims the benefit of Japanese Priority Patent Application JP 2013-088074 filed 19 Apr. 2013, the entire contents of which are incorporated herein by reference.

BACKGROUND

The present disclosure relates to a signal transmission cable and a flexible printed board, and more particularly to a signal transmission cable and a flexible printed board, by which a low loss, space-saving parallel transmission path can be provided.

In recent years, for example, there are more and more needs for increasing the speed and volume of data communication in electronic apparatuses such as a smart phone. Correspondingly, a signal frequency is becoming higher, for example, a range of from several GHz to several tens of GHz.

Also, in order to increase the signal rate, transmission paths are arranged in parallel and the number of channels is increased. Currently, for this purpose, thin coaxial parallel cables in which several to several tens of micro lines called thin coaxial lines are arranged in parallel are widely used.

However, even with such thin coaxial cables, in a frequency range of 20 GHz or higher, the dielectric loss due to the dielectric substance is increased, which deteriorates the cable properties.

For example, a metal waveguide is used from the past as a low-loss transmission path for a microwave band or a millimeter waveband. The metal waveguide has a rectangular or circular tubular hollow structure. The dielectric substance that causes the dielectric loss is the air, and hence the metal waveguide is characterized by extremely low loss.

However, it is difficult to arrange metal waveguides in parallel and reduce the weight thereof due to their structure. Further, the cost is high and a flexibility cannot be provided. Thus, there is a problem that the metal waveguides cannot be used as the parallel transmission paths in an electronic apparatus. Further, there is proposed a high-frequency flexible multiconductor cable connecting system including a structure similar to the coaxial structure is embedded in a film of a dielectric substance (for example, see Japanese Patent Application Laid-open No. 2003-203694 (hereinafter, referred to as Patent Document 1). In the technique of Patent Document 1, after cables of a rectangular coaxial structure having central conductors, through which signals are transmitted, is surrounded with an insulating material, and the insulating material is further coated with an external conductor are formed, a plurality of such cables are bundled in parallel, whereby means for achieving high-speed transmission and improvement of anti-noise characteristic are provided. At a fitting portion for connecting the multiconductor cable to a control circuit, the central conductor of the cable portion is projected. On the contrary, the central conductor is recessed at a cable fitting portion. Alternatively, their structures are converted, whereby the fitting portions are connected in close contact to retain the continuity of line impedance matching.

In addition, in recent years, there is proposed a dielectric waveguide that forms a structure of a waveguide embedded in a multi-layer wiring substrate with a dielectric substance.

This dielectric waveguide is also called a substrate integrated waveguide (SIW). The dielectric substance is sandwiched between two conductors and a plurality of via-holes connecting between the two conductors are arranged in two columns. In this manner, the dielectric waveguide performs a signal transmission at the same transmission mode as the metal waveguide. This dielectric waveguide is capable of performing a lower-loss transmission in comparison with the coaxial lines and is suitable for transmitting a signal having a frequency higher than several tens of GHz.

SUMMARY

However, in the technique of Patent Document 1, properties similar to those of the coaxial lines is provided, and hence the loss increases in a band of several tens of GHz. Also when the transmission paths are arranged in parallel, there is a disadvantage that the size increases in proportion to the number of transmission paths arranged in parallel.

Further, the SIW is incorporated in a dielectric substance such as ceramic, glass epoxy, or Teflon (Registered Trademark). Therefore, for example, the SIW is not suitable as a connection pathway between boards in an electronic apparatus, which needs to have a flexibility for downsizing.

In view of the above-mentioned circumstances, it is desirable to provide a low loss, space-saving parallel transmission path.

According to a first embodiment of the present disclosure, there is provided a signal transmission cable including:

- a multi-layer parallel transmission path including
  - two or more dielectric waveguides that are stacked in upper and lower directions, each of the dielectric waveguides including
    - a dielectric layer formed of a dielectric substance,
    - two conductive layers that are formed to sandwich the dielectric layer therebetween, and
    - two quasi-conductive walls including
      - a plurality of via-holes that are electrically connected to the two conductive layers, the two or more dielectric waveguides being arranged sharing the conductive layers in contact in the upper and lower directions;
- a single-layer parallel transmission path including
  - the two or more dielectric waveguides that are arranged in left- and right-hand directions on the same dielectric layer and the same conductive layer; and
- a single-layer/multi-layer conversion section configured to transmit a signal transmitted by each of the two or more dielectric waveguides arranged in the single-layer parallel transmission path to each of the two or more dielectric waveguides arranged in the multi-layer parallel transmission path.

The signal transmission cable may further include a connector including two or more pads that are arranged on one of the conductive layers, in which the two or more pads of the connector may be connected to the conductive layers constituting the dielectric waveguides of the single-layer parallel transmission path via a mode converter of a tapered microstrip type.

Each of the two or more pads may be supplied with a signal of each channel, and a pathway for transmission of the signal of each channel may be set to be equal in length, the signal being transmitted from each of the two or more pads to an end of the multi-layer parallel transmission path through a center of each of the dielectric waveguides.

The signal transmission cable may further include two or more patch antennas that are formed on the same conductive layer as the connector.

The single-layer/multi-layer conversion section may include a layer-converting window that is formed by removing part of the conductive layers of the dielectric waveguides, and the dielectric layers of the two dielectric waveguides adjacent to each other in the upper and lower directions may be connected to each other via the layer-converting window.

The signal transmission cable may further include a power-supply line that extends in parallel to the multi-layer parallel transmission path and is configured to transmit a power-supply voltage.

The dielectric layer in each of the dielectric waveguides may be partially hollowed out.

The dielectric layer may be formed of a liquid-crystal polymer or a polyimide.

According to a second embodiment of the present disclosure, there is provided a flexible printed board including:

a multi-layer parallel transmission path including
- two or more dielectric waveguides that are stacked in upper and lower directions, each of the dielectric waveguides including
  - a dielectric layer formed of a dielectric substance,
  - two conductive layers that are formed to sandwich the dielectric layer therebetween, and
  - two quasi-conductive walls including
    - a plurality of via-holes that are electrically connected to the two conductive layers, the two or more dielectric waveguides being arranged sharing the conductive layers in contact in the upper and lower directions;

a single-layer parallel transmission path including
- the two or more dielectric waveguides that are arranged in left- and right-hand directions on the same dielectric layer and the same conductive layer; and a single-layer/multi-layer conversion section configured to transmit a signal transmitted by each of the two or more dielectric waveguides arranged in the single-layer parallel transmission path to each of the two or more dielectric waveguides arranged in the multi-layer parallel transmission path.

In the first and second embodiments of the present disclosure, provided are: a multi-layer parallel transmission path including two or more dielectric waveguides that are stacked in upper and lower directions, each of the dielectric waveguides including a dielectric layer formed of a dielectric substance, two conductive layers that are formed to sandwich the dielectric layer therebetween, and two quasi-conductive walls including a plurality of via-holes that are electrically connected to the two conductive layers, the two or more dielectric waveguides being arranged sharing the conductive layers in contact in the upper and lower directions; and a single-layer parallel transmission path including the two or more dielectric waveguides that are arranged in left- and right-hand directions on the same dielectric layer and the same conductive layer. A signal transmitted by each of the two or more dielectric waveguides arranged in the single-layer parallel transmission path is transmitted to each of the two or more dielectric waveguides arranged in the multi-layer parallel transmission path.

According to the embodiments of the present disclosure, it is possible to provide a low loss, space-saving parallel transmission path.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

Figure 1:
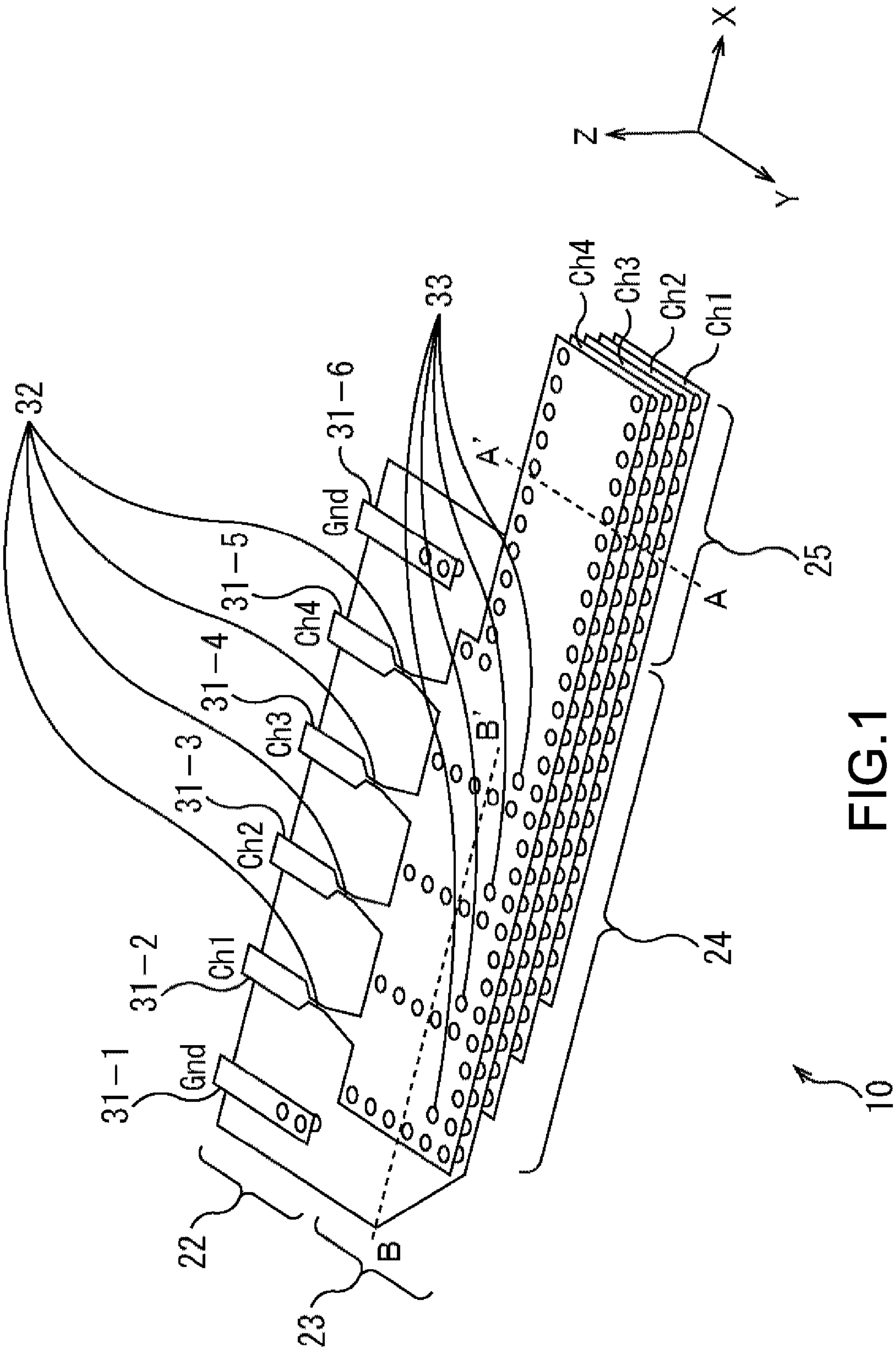
FIG. 1 is a perspective view showing an outer appearance of a signal transmission cable according to an embodiment of the present disclosure.

FIG. 1 is a perspective view showing an outer appearance of a signal transmission cable according to an embodiment of the present disclosure.

A signal transmission cable 10 shown in FIG. 1 has a multi-layer structure and is configured to transmit signals input into pads arranged in a connector section 22 in parallel.

Although will be described in later, the signal transmission cable 10 has a waveguide structure constituted of a dielectric layer sandwiched by two metal layers and through-holes (or via-holes) that penetrate through the dielectric layer to connect the two metal layers.

As shown in FIG. 1, the signal transmission cable 10 includes the connector section 22, a single-layer parallel waveguide section 23, a single-layer/multi-layer conversion section 24, and a multi-layer parallel waveguide section 25.

Pads 31-1 to 31-6 are arranged in the connector section 22. The pad 31-1 and the pad 31-6 are set as GND terminals. The pads 31-2 to 31-5 are set as signal terminals. For example, a signal of CH1 is supplied (or output) to the pad 31-2, the signal of CH2 is supplied (or output) to the pad 31-3, the signal of CH3 is supplied (or output) to the pad 31-4, and the signal of CH4 is supplied (or output) to the pad 31-5. That is, in this example, the four channel signals of CH1 to CH4 are transmitted in parallel by the signal transmission cable 10.

Lines being microstriplines are pulled out from the pads 31-2 to 31-5. The lines are connected to the single-layer parallel waveguide section 23 through micro-strip waveguide converters 32 of a tapered micro-strip type.

The four signals of CH1 to CH4 are mode-converted by the micro-strip waveguide converters 32. The micro-strip waveguide converters 32 convert the four signals of CH1 to CH4 input from the pads 31-2 to 31-5 from a TEM mode into a $TE_{10}$ mode. With this, the four signals of CH1 to CH4 are on a mode suitable for transmission by the waveguide.

Then, the four signals of CH1 to CH4 are horizontally parallelized and transmitted in the single-layer parallel waveguide section 23.

The single-layer parallel waveguide section 23 is set as an area in which the four signals of CH1 to CH4 are transmitted in waveguides in a single layer. Thus, the single-layer parallel waveguide section 23 is an area formed of four waveguides arranged in parallel in an XY-plane (will be referred to as horizontally parallelized).

The waveguides are arranged in parallel in the XY-plane in the single-layer parallel waveguide section 23. On the other hand, waveguides are arranged in a Z-axis direction in the multi-layer parallel waveguide section 25 (will be referred to as vertically parallelized).

A traveling direction of the four signals of CH1 to CH4 transmitted in parallel in the single-layer parallel waveguide section 23 are bent by 90° -bent via-holes by 90 degrees. In this manner, the four signals of CH1 to CH4 are transmitted in a direction in which the multi-layer parallel waveguide section 25 extends.

The single-layer/multi-layer conversion section 24 transmits the four signals of CH1 to CH4 to four-layer waveguides of the multi-layer parallel waveguide section 25, respectively. That is, the single-layer/multi-layer conversion section 24 vertically parallelizes the four signals of CH1 to CH4 horizontally parallelized and transmitted.

As mentioned above, the multi-layer parallel waveguide section 25 is waveguides provided in a plurality of layers. That is, in the multi-layer parallel waveguide section 25, the plurality of waveguides are stacked in a depth direction of the sheet.

In this example, the multi-layer parallel waveguide section 25 is constituted of four waveguides and the waveguides in the layers are configured to transmit the four signals of CH1 to CH4, respectively.

Figure 2:
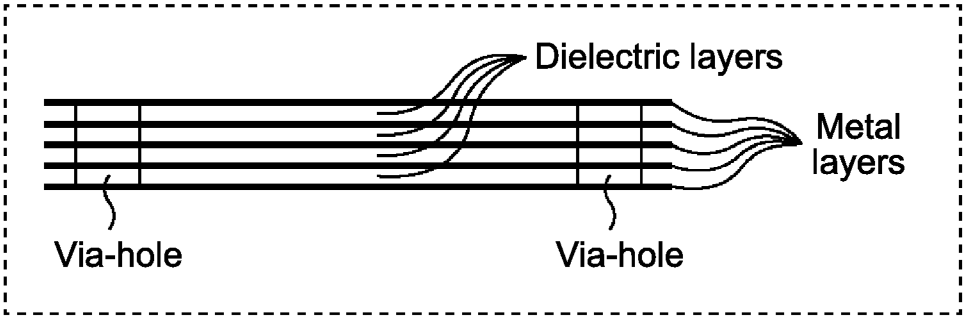
FIG. 2 is a cross-sectional view taken along the dotted-line of A-A' of FIG. 1, which explains a configuration of a multi-layer parallel waveguide.

FIG. 2 is a cross-sectional view taken along the dotted line A-A' of FIG. 1, which explains a configuration of the multi-layer parallel waveguide section 25. As shown in the figure, the multi-layer parallel waveguide section 25 is formed by stacking four dielectric layers each sandwiched between two metal layers. In other words, the multi-layer parallel waveguide section 25 is constituted of five metal layers and the four dielectric layers.

Further, at left and right ends in FIG. 2, through-holes (or via-holes) that penetrate through the dielectric layers and are electrically connected to the metal layers are provided. The via-holes are, for example, formed like metal circular columns. In FIG. 2, one via-hole is shown at each of the right and left. However, multiple via-holes are actually arranged in the depth direction of the sheet. The multiple via-holes are arranged in this manner, and hence quasi-conductive walls are formed. Thus, the dielectric layer is surrounded with conductive substances on upper and lower, left- and right-hand sides.

That is, the waveguide of the signal transmission cable 10 to which the embodiment of the present disclosure is applied serves as a dielectric waveguide. This is also referred to as a SIW (Substrate Integrated Waveguide). It performs a signal transmission on the same transmission mode as a metal waveguide. This dielectric waveguide is capable of performing a transmission with low loss in comparison with a coaxial line and suitable to transmit signals of several tens of GHz.

For example, an area formed of two metal layers, a single dielectric layer, and two (actually, multiple) via-holes on a lowermost side in the figure becomes a first layer of the multi-layer parallel waveguide section 25, and serves as the waveguide that transmits the signal of CH1. An area formed of two metal layers, a single dielectric layer, and two (actually, multiple) via-holes on an upper side thereof becomes a second layer of the multi-layer parallel waveguide section 25, and serves as the waveguide that transmits the signal of CH2. Similarly, third and fourth layers of the multi-layer parallel waveguide section 25 are formed and serve as the waveguides that transmit the signals of CH3 and CH4, respectively.

Figure 3:
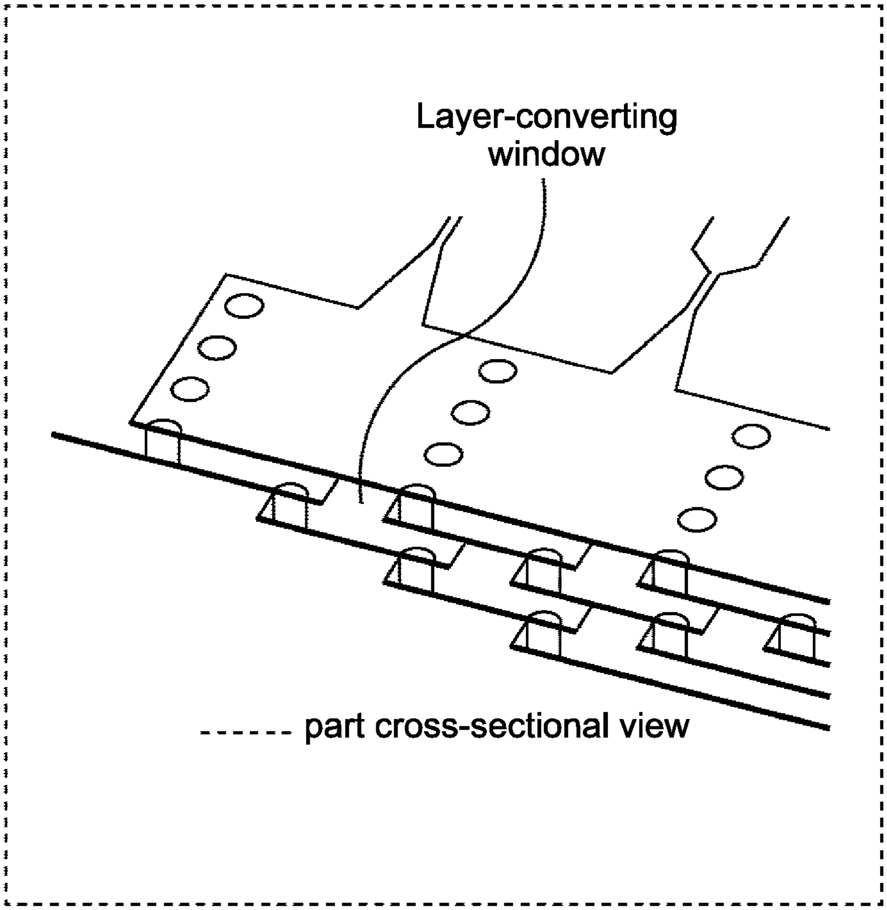
FIG. 3 is a cross-sectional view taken along the dotted-line of B-B' of FIG. 1, which explains a configuration of a single-layer/multi-layer conversion section.

FIG. 3 is a cross-sectional view of the dotted line B-B' of FIG. 1, which explains a configuration of the single-layer/multi-layer conversion section 24. As mentioned above, the single-layer/multi-layer conversion section 24 vertically parallelizes the four signals of CH1 to CH4 horizontally parallelized and transmitted.

As shown in FIG. 3, in the single-layer/multi-layer conversion section 24, a layer-converting window is provided at each point. The layer-converting window is one that removes part of the metal layer and connects the upper and lower dielectric layers.

For example, in the single-layer/multi-layer conversion section 24, the metal layer on the lower side that forms the waveguide in the uppermost layer is removed and the layer-converting window is formed. In this manner, the signal of CH1 is transmitted to the waveguide in a second layer from the top of the single-layer/multi-layer conversion section 24. Then, the signal of CH1 is transmitted to the waveguide in a third layer from the top since the metal layer on the lower side that forms the waveguide in the second layer from the top is removed such that the layer-converting window is formed. In addition, the signal of CH1 is transmitted to the waveguide in a lowermost layer through a layer-converting window of the waveguide in the third layer from the top. Note that the waveguide in the lowermost layer of the single-layer/multi-layer conversion section 24 is connected to the first layer of the multi-layer parallel waveguide section 25.

Further, the signal of CH2 is transmitted to the waveguide in the third layer from the top through the layer-converting window of the waveguide in the uppermost layer of the single-layer/multi-layer conversion section 24 and the layer-converting window of the waveguide in the second layer from the top. Note that the waveguide in the third layer from the top (second layer from the bottom) of the single-layer/multi-layer conversion section 24 is connected to the second layer of the multi-layer parallel waveguide section 25.

Further, the signal of CH3 is transmitted to the waveguide in the second layer from the top via the layer-converting window of the waveguide of the uppermost layer in the single-layer/multi-layer conversion section 24. Note that the waveguide in the second layer from the top (third layer from the bottom) of the single-layer/multi-layer conversion section 24 is connected to a third layer of the multi-layer parallel waveguide section 25.

Further, the signal of CH4 is transmitted in the waveguide in the uppermost layer without passing through the layer-converting window of the single-layer/multi-layer conversion section 24. Note that the waveguide in the uppermost layer (fourth layer from the bottom) in the single-layer/multi-layer conversion section 24 is connected to a fourth layer of the multi-layer parallel waveguide section 25.

In this manner, the signals horizontally parallelized and transmitted are vertically parallelized.

For the dielectric substance that forms the waveguide of the signal transmission cable 10, material such as glass epoxy, LTCC, Teflon (Registered Trademark), and polyimide that are generally used as a board material can be used. As the material has a smaller dissipation factor, the dielectric loss becomes smaller. Therefore, a low-loss transmission path can be realized.

Further, for the material of the metal layers and the via-holes that form the waveguides of the signal transmission cable 10, a general wiring material such as aluminum, copper, and gold can be used. If a material having a high electric conductivity is used, a conductor loss is reduced. Therefore, a low-loss transmission path can be realized.

Regarding the metal layers, the dielectric layers, and the via-holes that form the waveguide of the signal transmission cable 10, respective structures are used also in a general circuit board. They can be manufactured by plating, lithography, and etching techniques that are widely used in manufacture of boards.

The metal layers and the via-holes do not necessarily need to be formed of metal and the metal layers and the via-holes may be formed of a conductive material other than the metal. Thus, a configuration in which the dielectric layer is surrounded with the conductive layers formed of a certain conductive substance including the metal is adopted, the waveguide according to the embodiment of the present disclosure can be formed.

As mentioned above, in the present disclosure, the signal transmission by the waveguide is performed. The transmission by the waveguide has lower loss in comparison with a planar line, and hence, for example, a lower-loss transmission path can be realized in comparison with a general cable or the like. Further, the waveguide of the signal transmission cable 10 can be realized with an extremely thin structure, and hence the number of layers can be easily increased.

Although the five metal layers are provided to form a four-channel transmission path in the above embodiment, more waveguides may be stacked to increase the number of channels. Note that, according to the embodiment of the present disclosure, in stacking the waveguides, a thickness per one layer may be set to about 50 μm. For example, even in the case where a twenty-channel transmission path is formed, the thickness thereof can be thin, about 1 mm.

Next, a width of the waveguide will be described.

The width of the waveguide is defined by a cut-off frequency of the waveguide. Regarding a general rectangular waveguide, a signal having a wavelength equal to or longer than one-half of the wavelength in the dielectric substance cannot pass through the waveguide. The frequency corresponding to the wavelength at this time will be referred to as a cut-off frequency (Fc).

A signal transmitted via the signal transmission cable 10 is generally modulated by a carrier wave and transmitted, and hence a relationship between a carrier-wave frequency and Fc becomes a problem. Thus, it is necessary to set the carrier-wave frequency to be higher than Fc. In other words, by transmitting a signal having a high-frequency signal, it is possible to further reduce the width of the waveguide.

For example, in the case where a polyimide having a permittivity of 3.5 is used for an inter-layer film, Fc=26.7 GHz with the width of 3 mm, and Fc=80.1 GHz with the width of 11 mm.

As mentioned above, the signal transmission cable 10 to which the embodiment of the present disclosure is applied has a structure in which the waveguides are stacked in the multi-layer parallel waveguide section 25, and hence it is possible to make the cable thinner. Further, in recent years, a technique using a carrier wave having a high frequency of from several tens to several hundreds of GHz is also prevailing. With this, the cable can be made further thinner.

As described above, according to the embodiment of the present disclosure, it is possible to provide a low loss, space-saving parallel transmission path.

Figure 4:
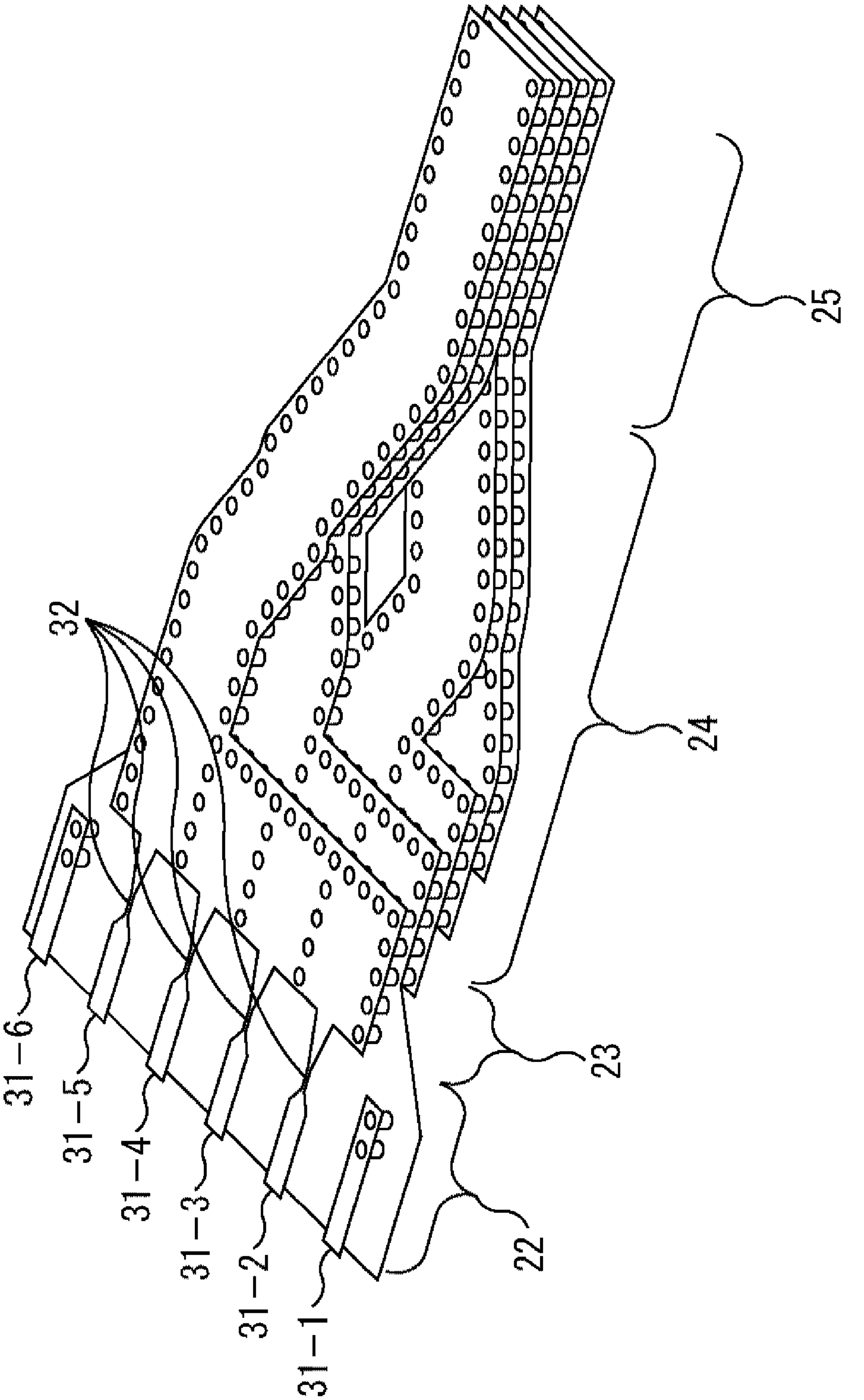
FIG. 4 is a perspective view showing an outer appearance of a signal transmission cable according to another embodiment of the present disclosure.

FIG. 4 is a perspective view showing an outer appearance of a signal transmission cable according to another embodiment of the present disclosure. A signal transmission cable 10 shown in FIG. 4 is configured considering a phase adjustment in the transmission path.

As in FIG. 1, the signal transmission cable 10 shown in FIG. 4 includes a connector section 22, a single-layer parallel waveguide section 23, a single-layer/multi-layer conversion section 24, and a multi-layer parallel waveguide section 25.

However, unlike FIG. 1, the signal transmission cable 10 shown in FIG. 4, pads 31-1 to 31-6 of the connector section 22 are attached in the same direction as a direction in which the multi-layer parallel waveguide section 25 extends. Further, unlike FIG. 1, waveguides in four layers of the signal transmission cable 10 shown in FIG. 4 are bent in different forms in the single-layer/multi-layer conversion section 24. In addition, unlike FIG. 1, the signal transmission cable 10 shown in FIG. 4 is not provided with 90° bent via-holes.

For example, with the configuration shown in FIG. 1, a length of a pathway necessary for a signal of CH1 input from the pad 31-2 to reach a right end of the multi-layer parallel waveguide section 25 in the figure is largely different from a length of a pathway necessary for a signal of CH4 input from the pad 31-5 to reach the right end of the multi-layer parallel waveguide section 25 in the figure. When the length of the transmission paths is different, the phase between signals that should be transmitted as signals having the same phase may be different, for example. That is because an offset (skew) of a transmission delay between the signals is caused. In particular, as the signals have a higher frequency, the influence to the phase due to the skew is increased.

Unlike FIG. 1, in the signal transmission cable 10 shown in FIG. 4, the length of the pathway necessary for the signal of CH1 input from the pad 31-2 to reach the right end of the multi-layer parallel waveguide section 25 in the figure is equal to a length of a pathway necessary for a signal of CH2 input from the pad 31-3 to reach the right end of the multi-layer parallel waveguide section 25 in the figure. Further, the length of the pathway necessary for a signal of CH3 input from the pad 31-4 to reach the right end of the multi-layer parallel waveguide section 25 in the figure is equal to a length of a pathway necessary for the signal of CH4 input from the pad 31-5 to reach the right end of the multi-layer parallel waveguide section 25 in the figure.

Configurations other than the above-mentioned portion of the signal transmission cable 10 of FIG. 4 is the same as that of FIG. 1, and hence detailed descriptions thereof will be omitted.

Figure 5:
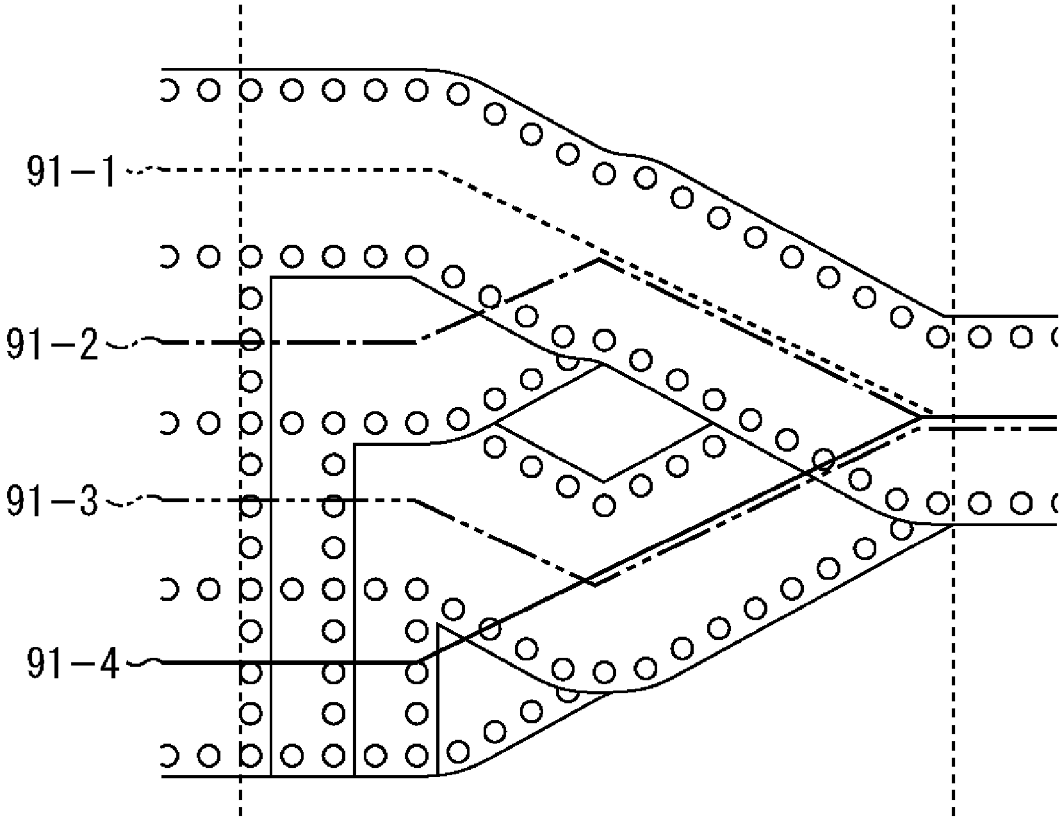
FIG. 5 is a view showing pathways of signals of CH1 to CH4 in the signal transmission cable shown in FIG. 4.

FIG. 5 is a view showing pathways of the four signals of CH1 to CH4 in the signal transmission cable 10 shown in FIG. 4. In the figure, a line 91-4 indicates a pathway of the signal of CH1, a line 91-3 indicates a pathway of the signal of CH2, the line 91-2 indicates a pathway of the signal of CH3, and the line 91-1 indicates a pathway of the signal of CH4. Note that the lines 91-1 to 91-4 are set as pathways passing through centers of the waveguides.

As shown in FIG. 5, the lines 91-1 to 91-4 all have the same length.

Figure 6:
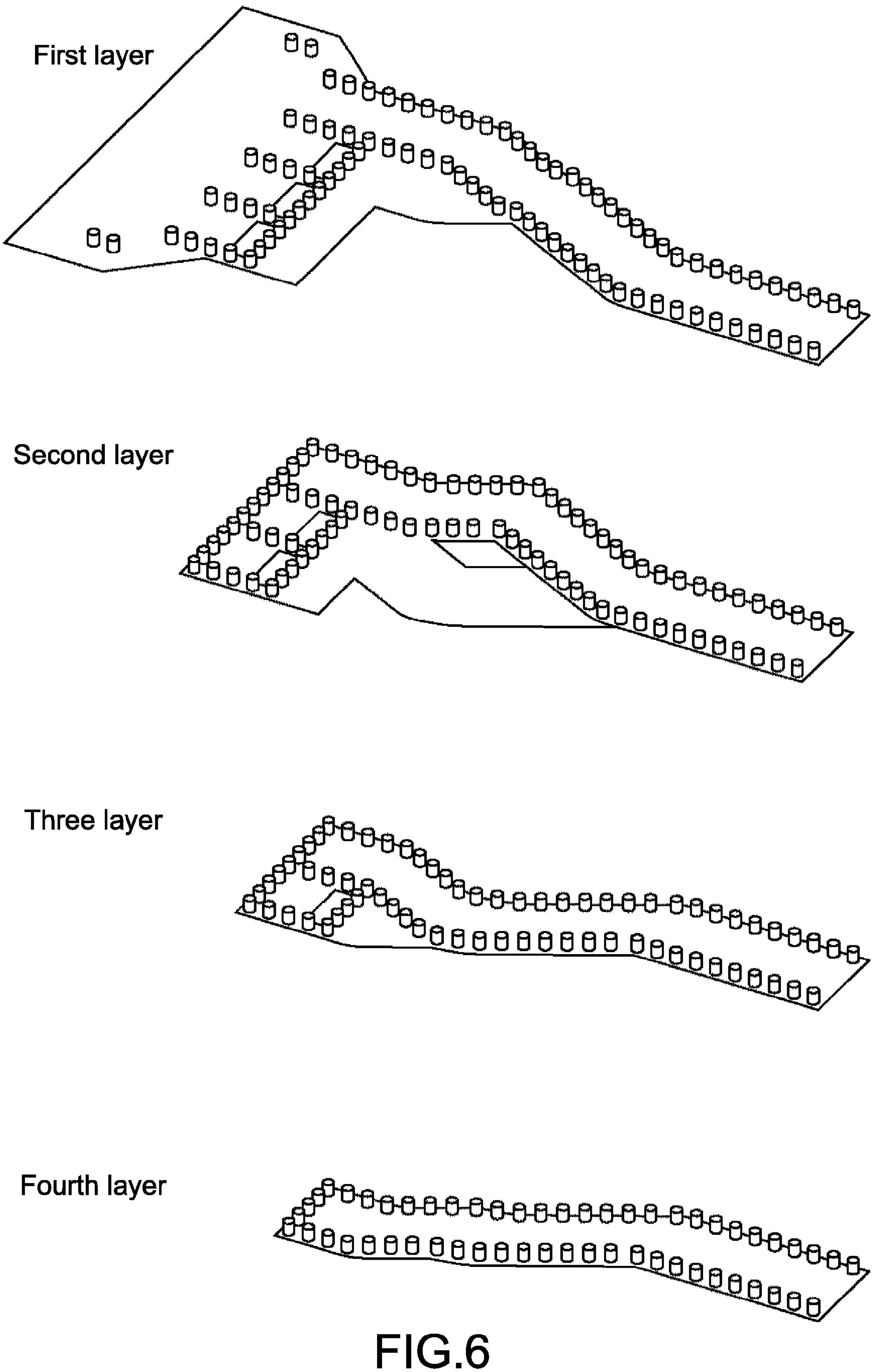
FIG. 6 is a view showing a configuration of each layer of the signal transmission cable shown in FIG. 4.

FIG. 6 is a view showing a configuration of each layer of the signal transmission cable 10 shown in FIG. 4.

As shown in the figure, the first layer forms an uppermost layer of the connector section 22, the single-layer parallel waveguide section 23, the single-layer/multi-layer conversion section 24, and the multi-layer parallel waveguide section 25 of the signal transmission cable 10. The second layer forms a second layer from the top of the single-layer/multi-layer conversion section 24 and the multi-layer parallel waveguide section 25 of the signal transmission cable 10. The third layer forms a third layer from the top of the single-layer/multi-layer conversion section 24 and the multi-layer parallel waveguide section 25 of the signal transmission cable 10. A fourth layer forms a fourth layer from the top of the multi-layer parallel waveguide section 25 of the signal transmission cable 10.

Note that, for example, the signal of CH1 is transmitted from the first layer to the fourth layer by the single-layer/multi-layer conversion section 24, and hence the pathway thereof is longer than those of the signals of CH2 to CH4. That is, the multi-layer parallel waveguide section 25 of the signal transmission cable 10 is configured to be vertically parallelized. Therefore, actually, the length of the pathway necessary for vertical transmission is different for each of the signals of channels. However, as described above, according to the embodiment of the present disclosure, when the waveguide is stacked, the thickness per one layer can be extremely thin, about 50 μm. Thus, a difference in the length of the pathways in the vertical direction can be ignored with respect to the influence to the phase.

In this manner, according to the embodiment of the present disclosure, it is possible to provide a low skew, low loss, space-saving parallel transmission path.

Note that FIG. 4 is an example of a configuration considering a phase adjustment in the transmission path, and a different configuration may also be employed. In brief, the pathways for transmission of the signals of the channels only need to be equal in length.

Figure 7A:
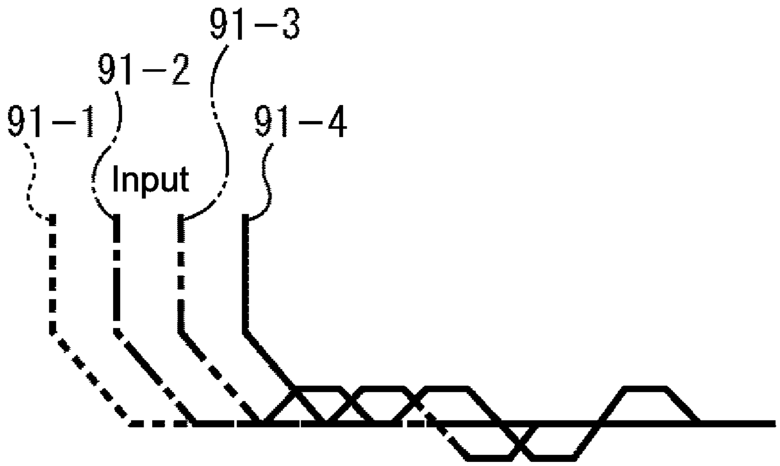
FIGS. 7A and 7B are views showing another example of a configuration in which lengths of pathways for signal transmission of channels are equal.
Figure 7B:
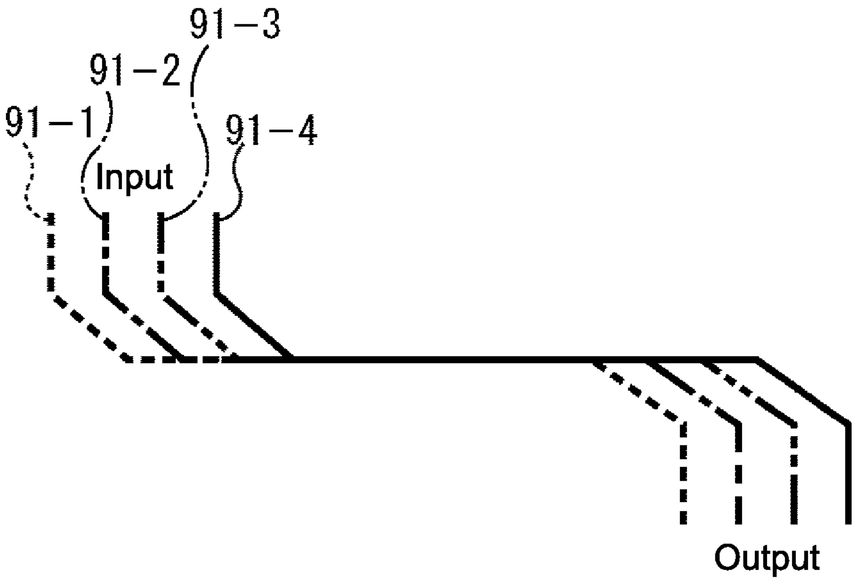

FIGS. 7A and 7B are views showing another example of a configuration in which the pathways for transmission of the signals of the channels are equal in length.

For example, as shown in FIG. 7A, a pathway having a short distance between the pad and the multi-layer parallel waveguide may be made serpentine within the multi-layer parallel waveguide. In this example, the line 91-4 is largely serpentine and the line 91-3 and the line 91-2 are also serpentine. However, the line 91-1 is not serpentine.

Further, for example, a pathway having a short distance between the pad and the multi-layer parallel waveguide on an input side may be provided such that the distance between the pad and the multi-layer parallel waveguide is long on an output side. For example, the line 91-4 is provided such that the distance between the pad and the multi-layer parallel waveguide is short on the input side while the distance between the pad and the multi-layer parallel waveguide is long on the output side. Further, for example, the line 91-1 is provided such that the distance between the pad and the multi-layer parallel waveguide is long on the input side while the distance between the pad and the multi-layer parallel waveguide is short on the output side.

For example, by employing the configuration as shown in FIG. 7A or 7B, the pathways for the transmission of the signals of the channels can be made equal in length. Thus, it is still possible to provide a low skew, low loss, space-saving parallel transmission path.

Figure 8:
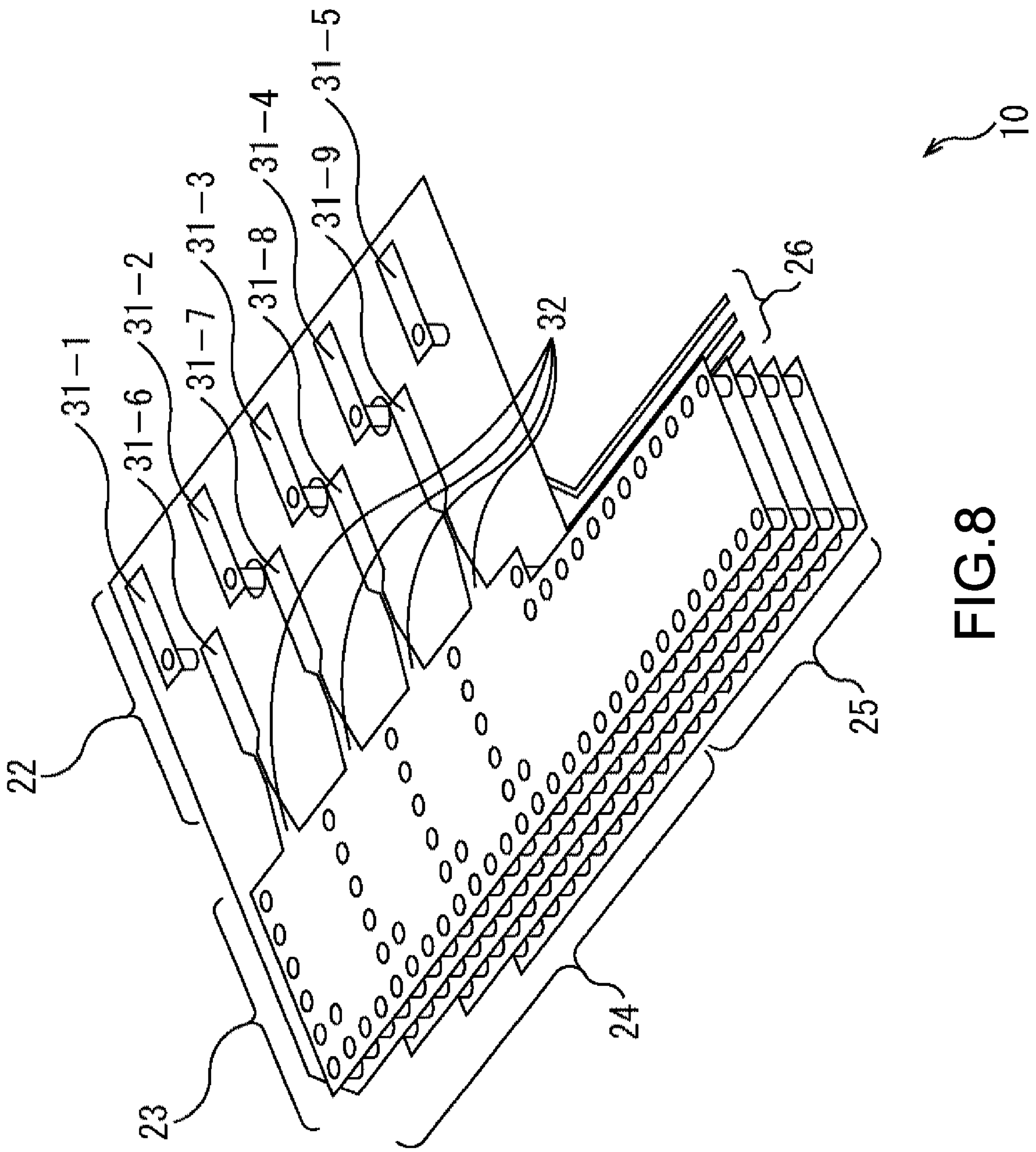
FIG. 8 is a perspective view showing an outer appearance of a signal transmission cable according to still another embodiment of the present disclosure.

FIG. 8 is a perspective view showing an outer appearance of a signal transmission cable according to still another embodiment of the present disclosure. A signal transmission cable 10 shown in FIG. 8 has a configuration in which more pads can be arranged and a transmission of a power-supply voltage can be performed as well as a signal transmission.

As in FIG. 1, the signal transmission cable 10 shown in FIG. 8 includes a connector section 22, a single-layer parallel waveguide section 23, a single-layer/multi-layer conversion section 24, and a multi-layer parallel waveguide section 25.

However, unlike FIG. 1, in the signal transmission cable 10 shown in FIG. 8, pads of the connector section 22 are arranged in a staggered form and nine pads of pads 31-1 to 31-9 are arranged.

The pads are arranged in a staggered form, and hence it is possible to increase the number of pads without increasing the area of the connector section 22.

Note that, although the pads are arranged in a two-column staggered form in the connector section 22 in the example of FIG. 8, the pads may be arranged three or more staggered form, for example. Further, for example, if the area of the connector section 22 can be increased, the pads may be arranged in a matrix form without needing to be arranged in the staggered form.

Further, unlike FIG. 1, the signal transmission cable 10 shown in FIG. 8 includes power-supply lines 26 extending in parallel with the multi-layer parallel waveguide section 25. In this example, three power-supply lines are provided as the power-supply lines 26.

As mentioned above, the waveguide cannot transmit a signal having a frequency lower than the cut-off frequency Fc, and hence the transmission of the power-supply voltage needs to be performed via the power-supply lines 26. On the other hand, the waveguide has a configuration of being shielded with GND metal layers, and hence, even if the power-supply lines 26 are arranged near the multi-layer parallel waveguide section 25, influences of noise due to an interference and the like can be eliminated.

That is, according to the embodiment of the present disclosure, without reducing an SI (Signal integrity), it is possible to perform the transmission of the power-supply voltage as well as the signal transmission.

Configurations other than the above-mentioned portion of the signal transmission cable 10 of FIG. 8 is the same as that of FIG. 1, and hence detailed descriptions thereof will be omitted.

By the way, the material of the dielectric layer in the above-mentioned embodiments is desirably a soft material such as a polyimide and a liquid-crystal polymer. For example, the dielectric layer is formed in an elongated cable-like shape corresponding to the pattern of the metal layer.

Figure 9:
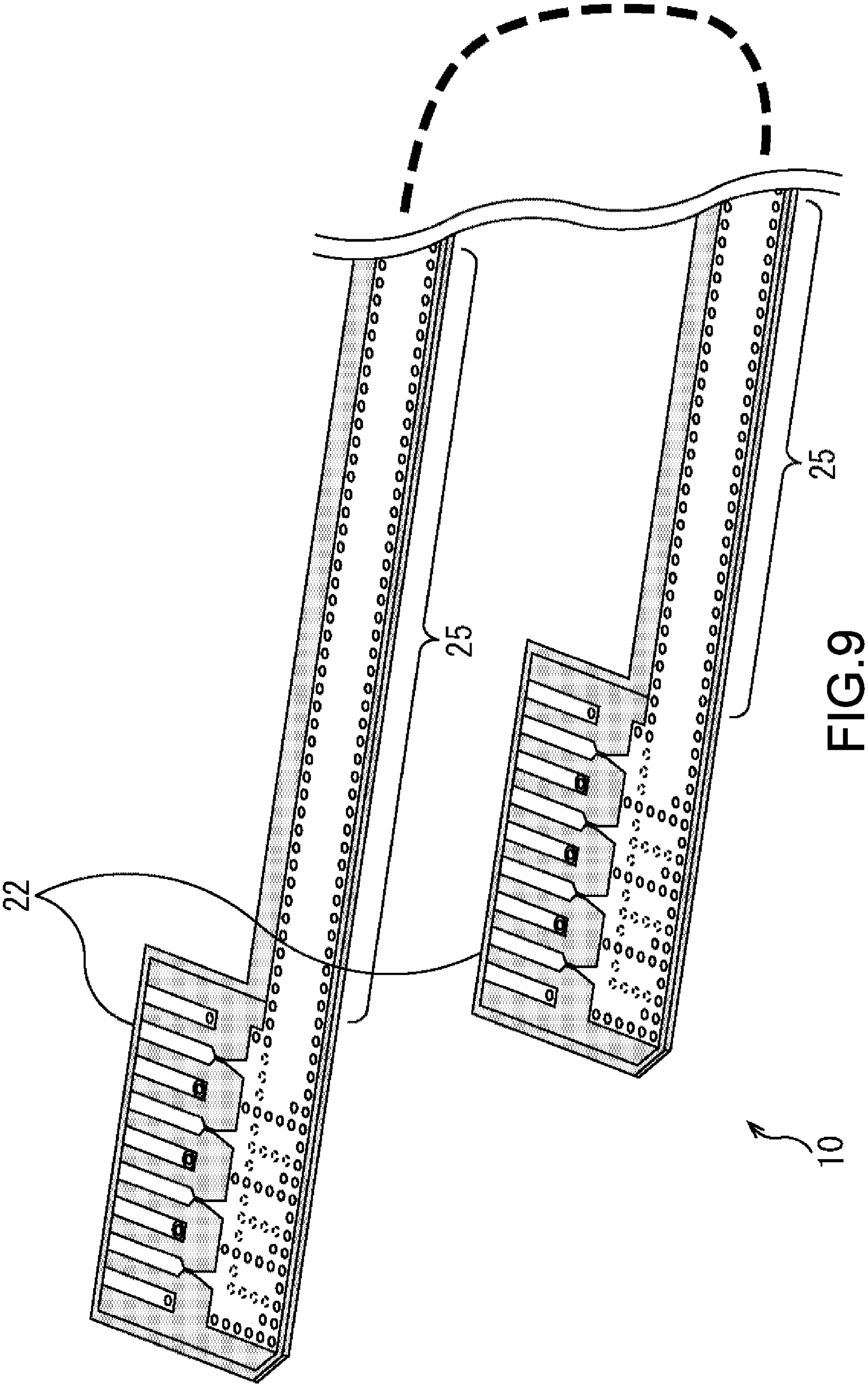
FIG. 9 is a view showing an example of a shape of the dielectric layer in the signal transmission cable 10 to which the embodiment of the present disclosure is applied.

FIG. 9 is a view showing an example of a shape of the dielectric layer in the signal transmission cable 10 to which the embodiment of the present disclosure is applied. The portion shown in dark color in the figure is formed of a dielectric substance. As the material of the dielectric substance, for example, a polyimide or a liquid-crystal polymer is used.

The dielectric layer is formed of the soft material such as a polyimide and a liquid-crystal polymer, and hence it is possible to realize a flexible printed circuit board (FPC) having the same flexible performance as a widely used FPC and high-frequency properties superior to the FPC in the related art. Further, the metal layers, the dielectric layers, and the via-holes according to the embodiments described above are used also in the general FPC. Those metal layers, dielectric layers, and via-holes can be easily manufactured by plating, lithography, and etching techniques widely used in manufacture of FPCs.

Although it is assumed that the waveguide is filled with the dielectric layer in the above-mentioned embodiments, the inside of the waveguide may be partially hollowed out. When the inside of the waveguide is hollowed out, it is possible to minimize the loss. However, it is difficult to keep the softness in this case. That is because, in the waveguide formed as a cavity surrounded with the metal layers, a cross-sectional deformation is caused due to bending. Therefore, for example, as shown in FIG. 10, the dielectric substance inside the waveguide is partially hollowed out.

Figure 10:
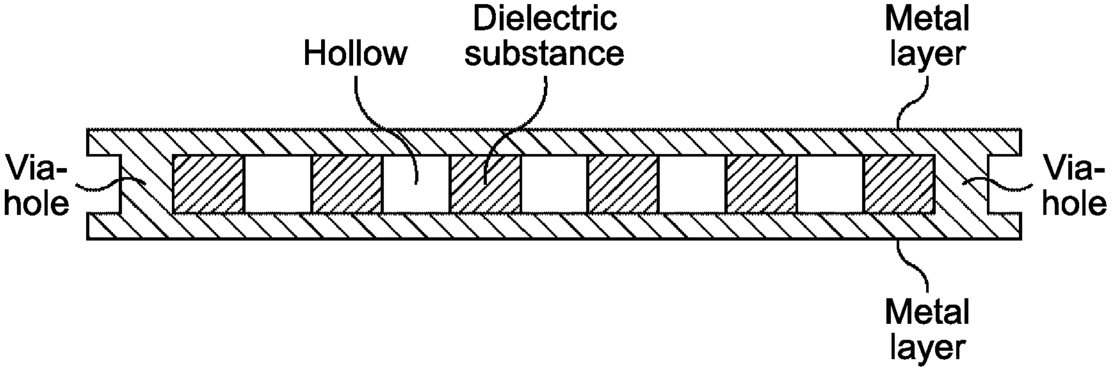
FIG. 10 is a cross-sectional view showing an example of a case where the dielectric substance inside the waveguide is partially hollowed out.

FIG. 10 is a cross-sectional view showing an example of a case where the dielectric substance inside the waveguide is partially hollowed out. As shown in the figure, the dielectric substance is sandwiched by two upper and lower metal layers and by left and right via-holes, and the waveguide is formed. In the example of FIG. 10, the dielectric substance inside the waveguide is hollowed out in the depth direction of the sheet at five points.

Figure 11B:
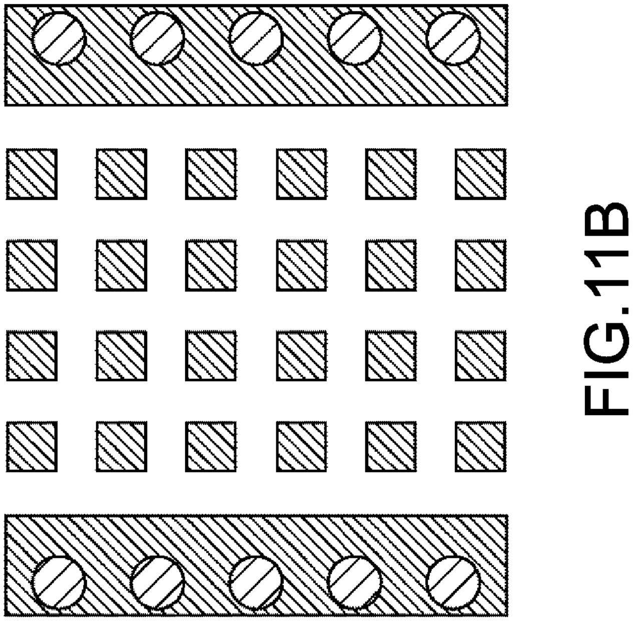
FIGS. 11A and 11B are plan views of the waveguide corresponding to a cross-sectional view of FIG. 10.
Figure 11A:
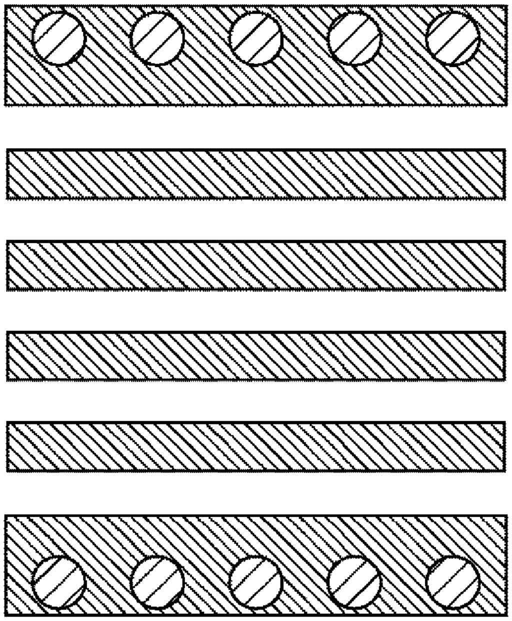

FIGS. 11A and 11B are plan views of the waveguide corresponding to a cross-sectional view of FIG. 10. In FIGS. 11A and 11B, the circulars in the figure indicate the via-holes.

For example, as shown in FIG. 11A, the dielectric substance inside the waveguide may be hollowed out in a linear shape. Alternatively, as shown in FIG. 11B, the dielectric substance inside the waveguide may be hollowed out in a dot-like shape.

For example, as shown in FIGS. 10 and 11, the dielectric substance inside the waveguide is partially hollowed out, and hence it is possible to form a flexible printed circuit board having lower loss and keeping the softness.

Figure 12:
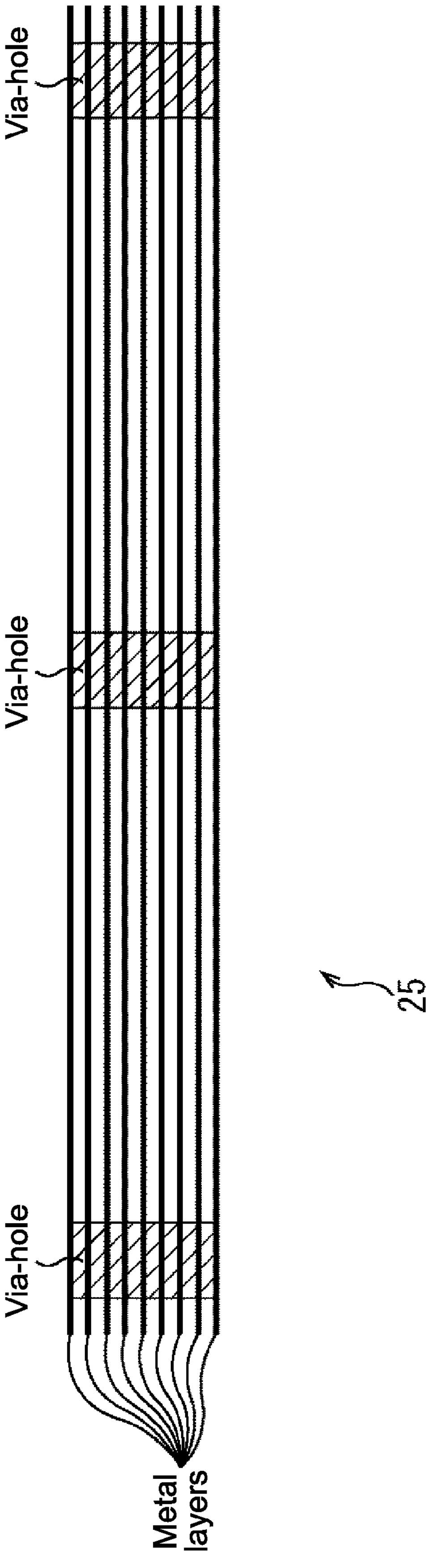
FIG. 12 is a view showing another example relating to a stacking state of the waveguide inside the multi-layer parallel waveguide section 25.

FIG. 12 is a view showing another example relating to a stacking state of the waveguides in the multi-layer parallel waveguide section 25. In the example of the figure, waveguides in eight layers are stacked in the vertical direction in the figure and waveguides in two columns are arranged in a horizontal direction in the figure. That is, the nine metal layers are arranged, the eight dielectric layers are arranged between the respective metal layers, and the via-holes in three columns are arranged. Note that, in this case, the via-hole in the center of the figure is shared by the waveguide on the left side and the waveguide on the right side of the figure.

When the multi-layer parallel waveguide section 25 is configured as shown in FIG. 12, signals of 16 (=8*2) channels can be transmitted in parallel.

The waveguides in the multi-layer parallel waveguide section 25 may be stacked in this manner.

Note that waveguides in two or more columns may also be arranged in the horizontal direction, of course.

Figure 13:
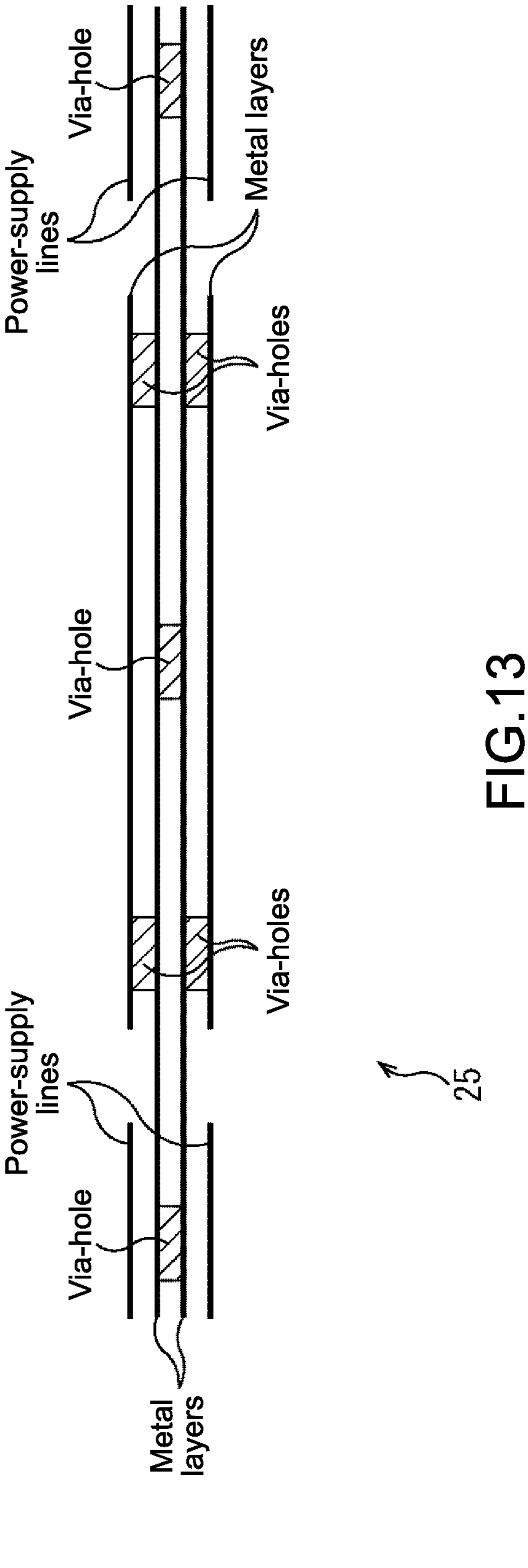
FIG. 13 is a view showing still another example relating to the stacking state of the waveguide inside the multi-layer parallel waveguide section 25.

FIG. 13 is a view showing still another example of the stacking state of the waveguides in the multi-layer parallel waveguide section 25. In the example of the figure, waveguides in three layers are stacked in the vertical direction in the figure and waveguides in one or two columns are arranged in the horizontal direction in the figure. In other words, the single waveguide is provided in an upper layer in the figure, the two waveguides are provided in a middle layer in the figure, and the single waveguide is provided in a lower layer in the figure.

In the example of FIG. 13, power-supply lines are arranged at four corners of the multi-layer parallel waveguide section 25.

The waveguides in the multi-layer parallel waveguide section 25 may be stacked in this manner.

Figure 14:
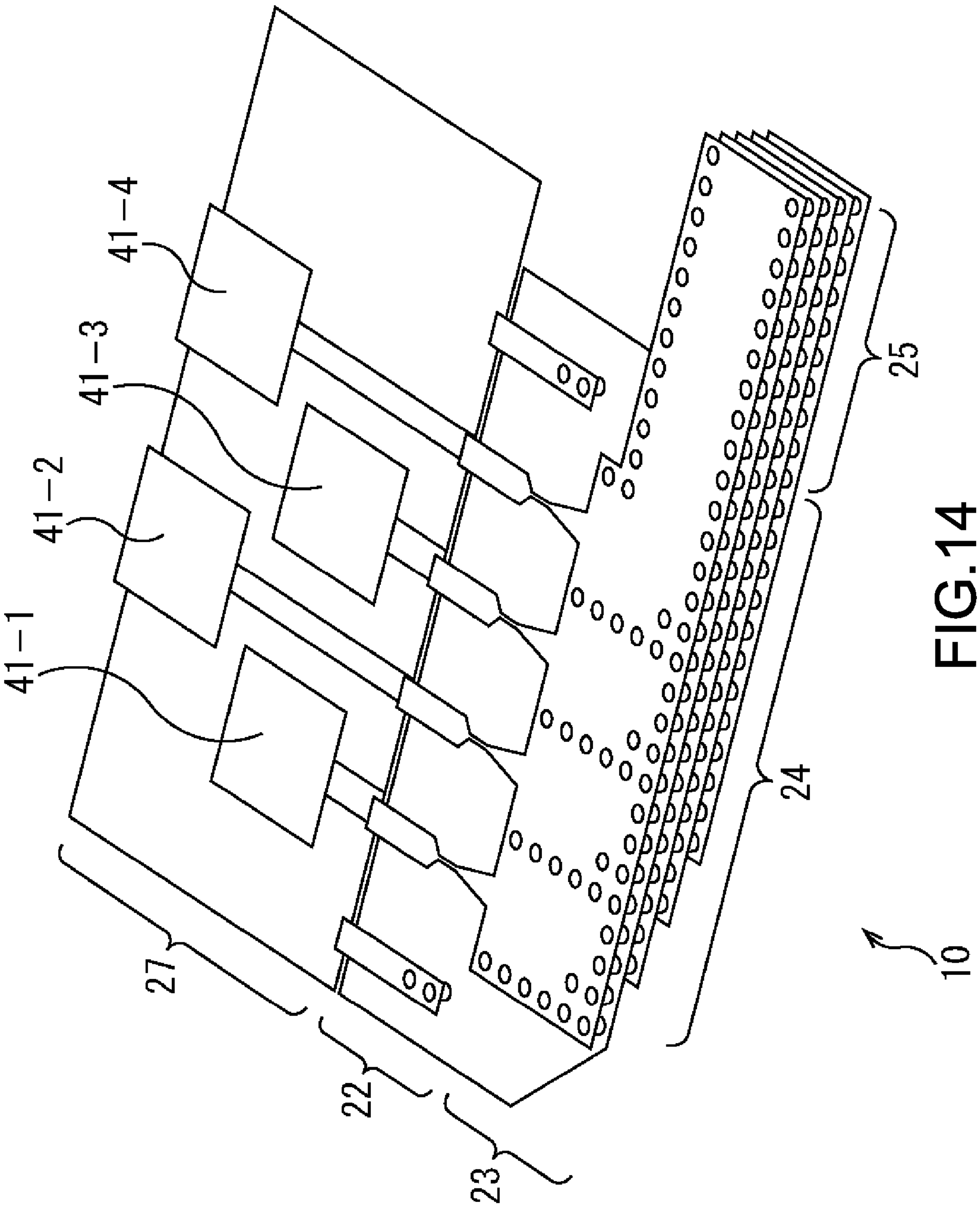
FIG. 14 is a perspective view showing an outer appearance of a signal transmission cable according to still another embodiment of the present disclosure.

FIG. 14 is a perspective view showing an outer appearance of a signal transmission cable according to still another embodiment of the present disclosure. A signal transmission cable 10 shown in FIG. 14 is configured to be usable as a power-feeding line to an antenna, for example, when a wireless communication is performed between boards.

The signal transmission cable 10 shown in FIG. 14 includes a connector section 22, a single-layer parallel waveguide section 23, a single-layer/multi-layer conversion section 24, a multi-layer parallel waveguide section 25, and an antenna array 27.

In the antenna array 27, patch antennas 41-1 and 41-4 are arranged. In the configuration of FIG. 14, signals sent by the patch antennas 41-1 and 41-4 or signals received by the patch antennas 41-1 and 41-4 are transmitted in parallel.

The patch antennas 41-1 and 41-4 can be formed at the same time in a machining process of the metal layers. Further, in the configuration of FIG. 14, the patch antennas 41-1 and 41-4 and the pads 31-2 to 31-5 can be machined as the same metal layers, and hence it is possible to suppress the signal loss at a boundary between the antenna array 27 and the connector section 22.

In the above-mentioned embodiment, the signal transmission cable 10 to which the embodiment of the present disclosure is applied is configured as a single body. However, for example, the signal transmission cable 10 to which the embodiment of the present disclosure is applied may be formed inside an organic multi-layer substrate. Specifically, a plurality of wiring layers in the organic multi-layer substrate may be used as the metal layers of the signal transmission cable 10 and a plurality of substrate layers in the organic multi-layer substrate may be used as the dielectric layers of the signal transmission cable 10.

In this case, for example, the signal transmission cable 10 is formed inside a flexible printed circuit board on which a single processing section, a sensor circuit, and the like are formed. That is, the present disclosure may also be applied to the flexible printed circuit board.

Note that the series of processing described herein of course include processing performed in time series in the described order and the series of processing do not necessarily need to be processed in time series. The series of processing may also include processing performed in parallel or individually.

Further, embodiments of the present disclosure are not limited to the above-mentioned embodiments and may be variously changed without departing from the gist of the present disclosure.

Note that the present disclosure may also take the following configurations.

(1) A signal transmission cable, including:
 a multi-layer parallel transmission path including
 two or more dielectric waveguides that are stacked in upper and lower directions, each of the dielectric waveguides including
  a dielectric layer formed of a dielectric substance,
  two conductive layers that are formed to sandwich the dielectric layer therebetween, and
  two quasi-conductive walls including
   a plurality of via-holes that are electrically connected to the two conductive layers, the two or more dielectric waveguides being arranged sharing the conductive layers in contact in the upper and lower directions;
 a single-layer parallel transmission path including
 the two or more dielectric waveguides that are arranged in left- and right-hand directions on the same dielectric layer and the same conductive layer; and
 a single-layer/multi-layer conversion section configured to transmit a signal transmitted by each of the two or more dielectric waveguides arranged in the single-layer parallel transmission path to each of the two or more dielectric waveguides arranged in the multi-layer parallel transmission path.

(2) The signal transmission cable according to (1), further including a connector including two or more pads that are arranged on one of the conductive layers, in which the two or more pads of the connector are connected to the conductive layers constituting the dielectric waveguides of the single-layer parallel transmission path via a mode converter of a tapered micro-strip type.

(3) The signal transmission cable according to (2), in which each of the two or more pads is supplied with a signal of each channel, and a pathway for transmission of the signal of each channel is set to be equal in length, the signal being transmitted from each of the two or more pads to an end of the multi-layer parallel transmission path through a center of each of the dielectric waveguides.

(4) The signal transmission cable according to (4), further including two or more patch antennas that are formed on the same conductive layer as the connector.

(5) The signal transmission cable according to any one of (1) to (4), in which the single-layer/multi-layer conversion section includes a layer-converting window that is formed by removing part of the conductive layers of the dielectric waveguides, and the dielectric layers of the two dielectric waveguides adjacent to each other in the upper and lower directions are connected to each other via the layer-converting window.

(6) The signal transmission cable according to (1) to (5), further including a power-supply line that extends in parallel to the multi-layer parallel transmission path and is configured to transmit a power-supply voltage.

(7) The signal transmission cable according to any one of (1) to (6), in which the dielectric layer in each of the dielectric waveguides is partially hollowed out.

(8) The signal transmission cable according to any one of (1) to (7), in which the dielectric layer is formed of a liquid-crystal polymer or a polyimide.

(9) A flexible printed board, including:

a multi-layer parallel transmission path including two or more dielectric waveguides that are stacked in upper and lower directions, each of the dielectric waveguides including a dielectric layer formed of a dielectric substance, two conductive layers that are formed to sandwich the dielectric layer therebetween, and two quasi-conductive walls including a plurality of via-holes that are electrically connected to the two conductive layers, the two or more dielectric waveguides being arranged sharing the conductive layers in contact in the upper and lower directions;

a single-layer parallel transmission path including the two or more dielectric waveguides that are arranged in left- and right-hand directions on the same dielectric layer and the same conductive layer; and a single-layer/multi-layer conversion section configured to transmit a signal transmitted by each of the two or more dielectric waveguides arranged in the single-layer parallel transmission path to each of the two or more dielectric waveguides arranged in the multi-layer parallel transmission path.

It should be understood by those skilled in the art that various modifications, combinations, sub-combinations and alterations may occur depending on design requirements and other factors insofar as they are within the scope of the appended claims or the equivalents thereof.

What is claimed is:

1. A signal transmission cable, comprising:

a multi-layer parallel transmission path including two or more dielectric waveguides that are stacked in upper and lower directions, each of the dielectric waveguides including a dielectric layer formed of a dielectric substance, two conductive layers that are formed to sandwich the dielectric layer therebetween, and two quasi-conductive walls including a plurality of via-holes that are electrically connected to the two conductive layers, the two or more dielectric waveguides being arranged sharing the conductive layers in contact in the upper and lower directions;

a single-layer parallel transmission path including the two or more dielectric waveguides that are arranged in left- and right-hand directions on the same dielectric layer and the same conductive layer; and a single-layer/multi-layer conversion section configured to transmit a signal transmitted by each of the two or more dielectric waveguides arranged in the single-layer parallel transmission path to each of the two or more dielectric waveguides arranged in the multi-layer parallel transmission path.

2. The signal transmission cable according to claim 1, further comprising a connector including two or more pads that are arranged on one of the conductive layers, wherein the two or more pads of the connector are connected to the conductive layers constituting the dielectric waveguides of the single-layer parallel transmission path via a mode converter of a tapered micro-strip type.

3. The signal transmission cable according to claim 2, wherein each of the two or more pads is supplied with a signal of each channel, and a pathway for transmission of the signal of each channel is set to be equal in length, the signal being transmitted from each of the two or more pads to an end of the multi-layer parallel transmission path through a center of each of the dielectric waveguides.

4. The signal transmission cable according to claim 2, further comprising two or more patch antennas that are formed on the same conductive layer as the connector.

5. The signal transmission cable according to claim 1, wherein the single-layer/multi-layer conversion section includes a layer-converting window that is formed by removing part of the conductive layers of the dielectric waveguides, and the dielectric layers of the two dielectric waveguides adjacent to each other in the upper and lower directions are connected to each other via the layer-converting window.

6. The signal transmission cable according to claim 1, further comprising a power-supply line that extends in parallel to the multi-layer parallel transmission path and is configured to transmit a power-supply voltage.

7. The signal transmission cable according to claim 1, wherein the dielectric layer in each of the dielectric waveguides is partially hollowed out.

8. The signal transmission cable according to claim 1, wherein the dielectric layer is formed of a liquid-crystal polymer or a polyimide.

9. A flexible printed board, comprising:

a multi-layer parallel transmission path including two or more dielectric waveguides that are stacked in upper and lower directions, each of the dielectric waveguides including a dielectric layer formed of a dielectric substance, two conductive layers that are formed to sandwich the dielectric layer therebetween, and two quasi-conductive walls including a plurality of via-holes that are electrically connected to the two conductive layers, the two or more dielectric waveguides being arranged sharing the conductive layers in contact in the upper and lower directions;

a single-layer parallel transmission path including the two or more dielectric waveguides that are arranged in left- and right-hand directions on the same dielectric layer and the same conductive layer; and a single-layer/multi-layer conversion section configured to transmit a signal transmitted by each of the two or more dielectric waveguides arranged in the single-layer parallel transmission path to each of the two or more dielectric waveguides arranged in the multi-layer parallel transmission path.

* * * * *